(12) United States Patent
Ireland

(10) Patent No.: US 8,482,131 B2
(45) Date of Patent: Jul. 9, 2013

(54) VIA STRUCTURE

(75) Inventor: Philip J. Ireland, Nampa, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 116 days.

(21) Appl. No.: 13/194,986

(22) Filed: Jul. 31, 2011

(65) Prior Publication Data

US 2013/0026647 A1    Jan. 31, 2013

(51) Int. Cl.
     *H01L 23/48*      (2006.01)

(52) U.S. Cl.
     USPC ...... 257/774; 257/773; 257/776; 257/E23.01; 257/E23.011

(58) Field of Classification Search
     USPC ............... 257/774, E21.577, E21.578, 21.585–E21.588, E23.011, 773, 776, E23.01
     See application file for complete search history.

(56) References Cited

U.S. PATENT DOCUMENTS

| | | | |
|---|---|---|---|
| 6,897,475 B2 * | 5/2005 | Wang | 257/48 |
| 7,679,384 B2 * | 3/2010 | Chen et al. | 324/755.11 |
| 8,357,932 B2 * | 1/2013 | Matusiewicz | 257/48 |
| 2005/0167842 A1 * | 8/2005 | Nakamura et al. | 257/758 |
| 2007/0262370 A1 * | 11/2007 | Okada | 257/315 |
| 2008/0265247 A1 * | 10/2008 | Feustel et al. | 257/48 |
| 2009/0033353 A1 * | 2/2009 | Yu et al. | 324/765 |
| 2009/0050886 A1 * | 2/2009 | Lee et al. | 257/48 |
| 2010/0264545 A1 * | 10/2010 | Collins et al. | 257/773 |
| 2012/0080797 A1 * | 4/2012 | Daubenspeck et al. | 257/762 |

* cited by examiner

*Primary Examiner* — Jasmine Clark
(74) *Attorney, Agent, or Firm* — Winston Hsu; Scott Margo

(57) ABSTRACT

A via structure includes at least a first via set and a second via set electrically connected to the first via set. There is at least one via in the first via set and at least one via in the second via set. The via in the first via set has a cross-sectional area which is larger than that of the via in the second via set.

19 Claims, 3 Drawing Sheets

VIA STRUCTURE

BACKGROUND OF THE INVENTION

1. Field of the Invention

The present invention generally relates to forming a robust intermetallic via structure. In particular, the present invention is directed to creating a pyramiding via structure that allows for a gradual rise in temperature from one end to the other. This minimizes the effects of abrupt thermal gradients and related stress effects.

2. Description of the Prior Art

A back-end of line (BEOL) process is generally associated with a layer of metal which is deposited on a wafer to electrically connect active components, such as transistors or resistors, by wiring on the wafer. When high currents pass through the BEOL device, a temperature profile naturally develops due to the thermal energy coming from the Joule heating caused by the high current. Some electric connection media in the BEOL devices, such as vias, are made of tungsten (W) or other highly resistive contacts which are especially subject to the high Joule heating derived from such high currents.

As a result, the temperature developed within the BEOL devices, and within the vias in particular, is significantly higher than within the surrounding metals. This difference in temperature among the metal elements creates an abrupt temperature spike within the vicinity. This brings forth many reliability problems.

One problem is the potential failure of the BEOL device due to the sudden breakdown of the structure. A second problem is delamination of the structure due to stress created by the thermal expansion of the uneven temperature spike within the vicinity. This may bring forth yet another problem: the delamination of the structure will cause torsion and cracking of the entire structure, which makes the weak BEOL devices even more unreliable.

In light of the above, a novel interconnect structure is needed to overcome the problem of the abrupt temperature spike within the vicinity due to high current passing through highly resistive materials.

SUMMARY OF THE INVENTION

Accordingly, the present invention proposes a novel idea to allow high currents to pass through a via structure in spite of highly resistive materials. Therefore, the novel structure has a gradual temperature gradient across the structure because abrupt temperature changes result in less reliable devices.

The present invention in a first aspect proposes a via structure. The via structure includes at least a first via set which is electrically connected to a second via set by means of at least one via plug. There is at least one via plug in the first via set and only one via in the second via set. The first via set has a first cross-sectional area and a first surface area. The second via set has a second cross-sectional area and a second surface area. The second surface area is substantially larger than the first surface area so that the second cross-sectional area is substantially greater than the first cross-sectional area.

The present invention in a second aspect proposes a via structure. The via structure includes at least a first via set which is electrically connected to a second via set by means of at least one via plug. There is at least one first via plug in the first via set and a plurality of second via plugs in the second via set. The first via set has a first cross-sectional area and a first surface area. The second via set has a second cross-sectional area and a second surface area. The second surface area is substantially larger than the first surface area.

Owing to a large surface area, the thermal energy coming from the Joule heating due to high current is dissipated more easily. A larger cross-sectional area corresponding to the larger surface area lowers the current density within the via structure. Less thermal energy from the Joule heating is generated in spite of highly resistive materials. To sum up, the present invention creates a temperature gradient via chain structure by pyramiding down from a larger via plug or from multiple via plugs of large surface area to a single via.

With the above benefits, the novel via structure of the present invention has a much more gradual temperature gradient as opposed to the conventionally abrupt temperature gradient. All the problems caused by the abrupt temperature changes are thereby eliminated and the novel via structure of the present invention has more reliability under high currents.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a via structure with a large surface area and creates a temperature gradient in the via structure by pyramiding down from a large via plug or multiple via plugs of large surface area to a single via plug. A large surface area and a consequently large cross-sectional area allow high currents to pass through the via structure in spite of highly resistive materials. Therefore, the novel structure provides a smooth temperature gradient across the structure rather than the conventionally abrupt one. As abrupt temperature changes result in less reliable devices than gradual temperature changes, all the problems caused by abrupt temperature changes are eliminated and the novel via structure of the present invention is more reliable. Problems such as torsion, cracking or failure under high currents are prevented.

Figure 1:
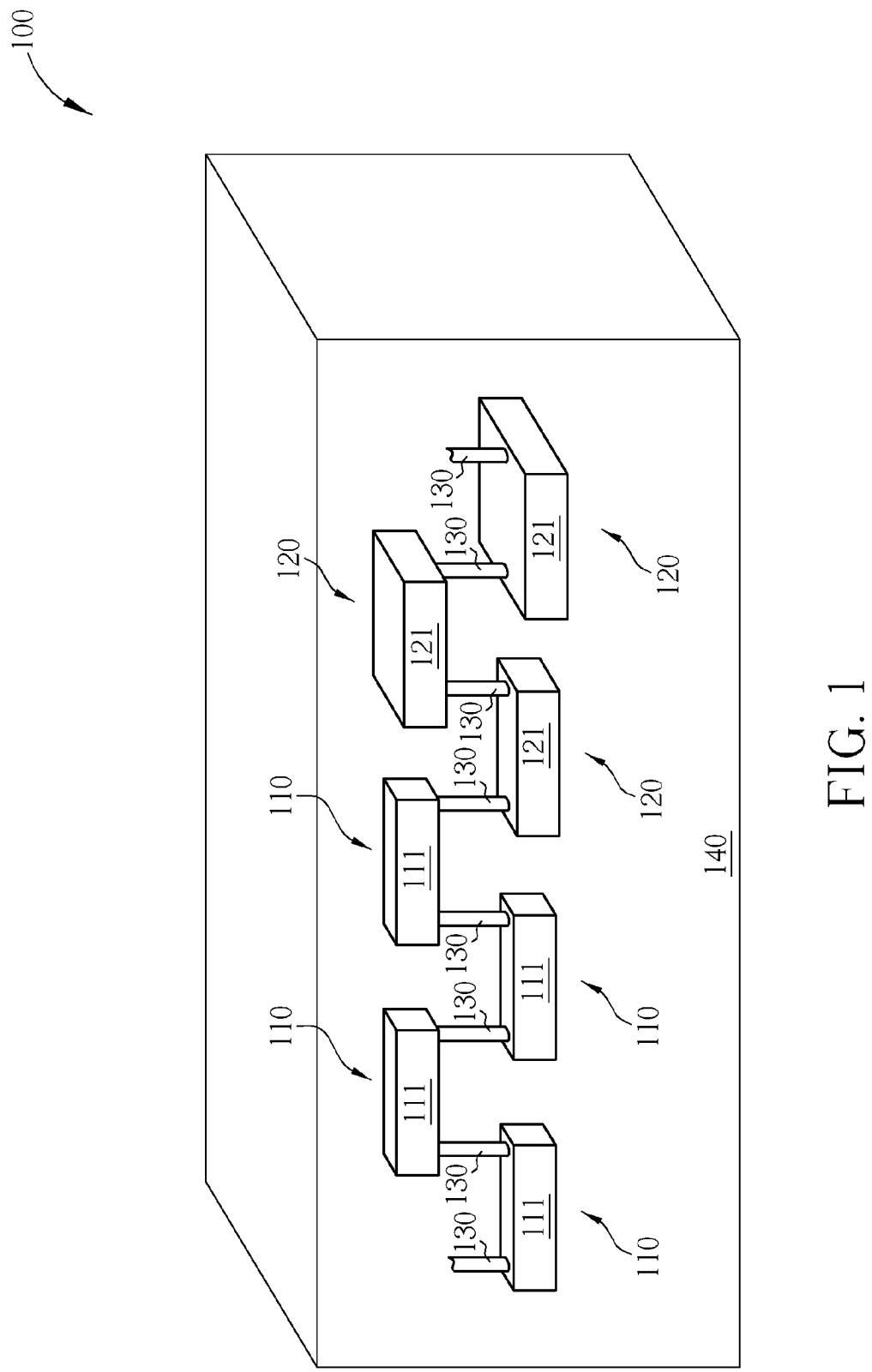
FIGS. 1 and 2 illustrate two exemplary embodiments of the pyramidal via structure of the present invention.
Figure 2:
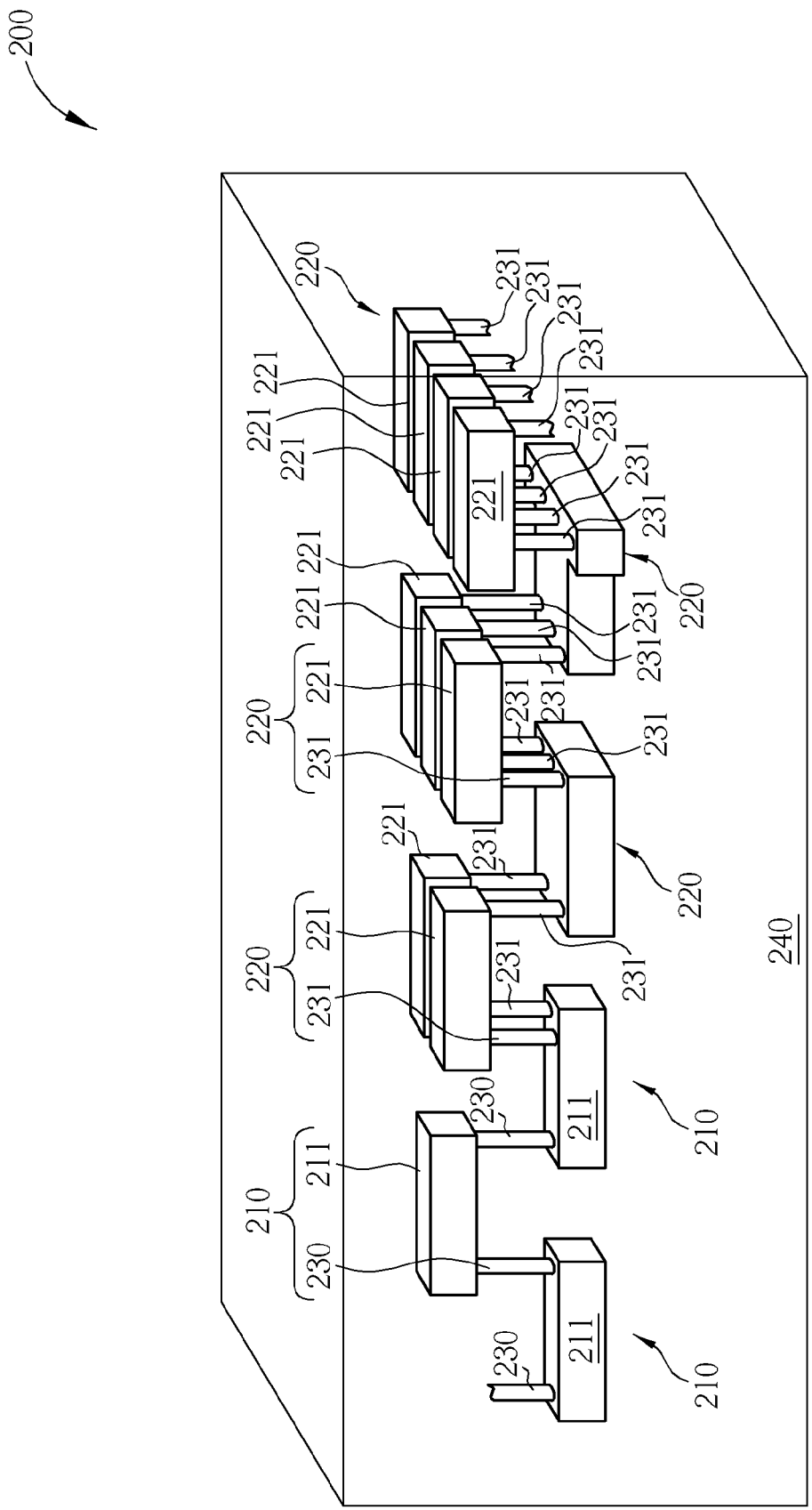

Please refer to FIGS. 1 and 2 which illustrate two exemplary embodiments of the pyramidal via structure of the present invention. The via structure of the present invention includes at least one first via set, at least one second via set, at least one metal line, at least one via plug and an insulating material. The second via set and the first via set together form an extending via chain. There is one via plug and one metal line in the first via set, and there is at least one via plug and at least one metal line in the second via set. The via plug in the first via set is electrically connected to the via plug in the second via set by means of the metal line disposed connecting the two.

The first via set, the second via set, the metal lines and the via plugs are all disposed in the insulating material. The insulating material keeps the first via set, the second via set, the metal lines and the via plugs electrically insulated from their neighboring elements (which are not shown). The first via set and the second via set are electrically connected to other suitable elements (not shown) or circuits (not shown). This via structure of the present invention can be used for routing high current circuits or for electromigration (EM) testing in order to keep the device from failing in the field.

Figure 3:
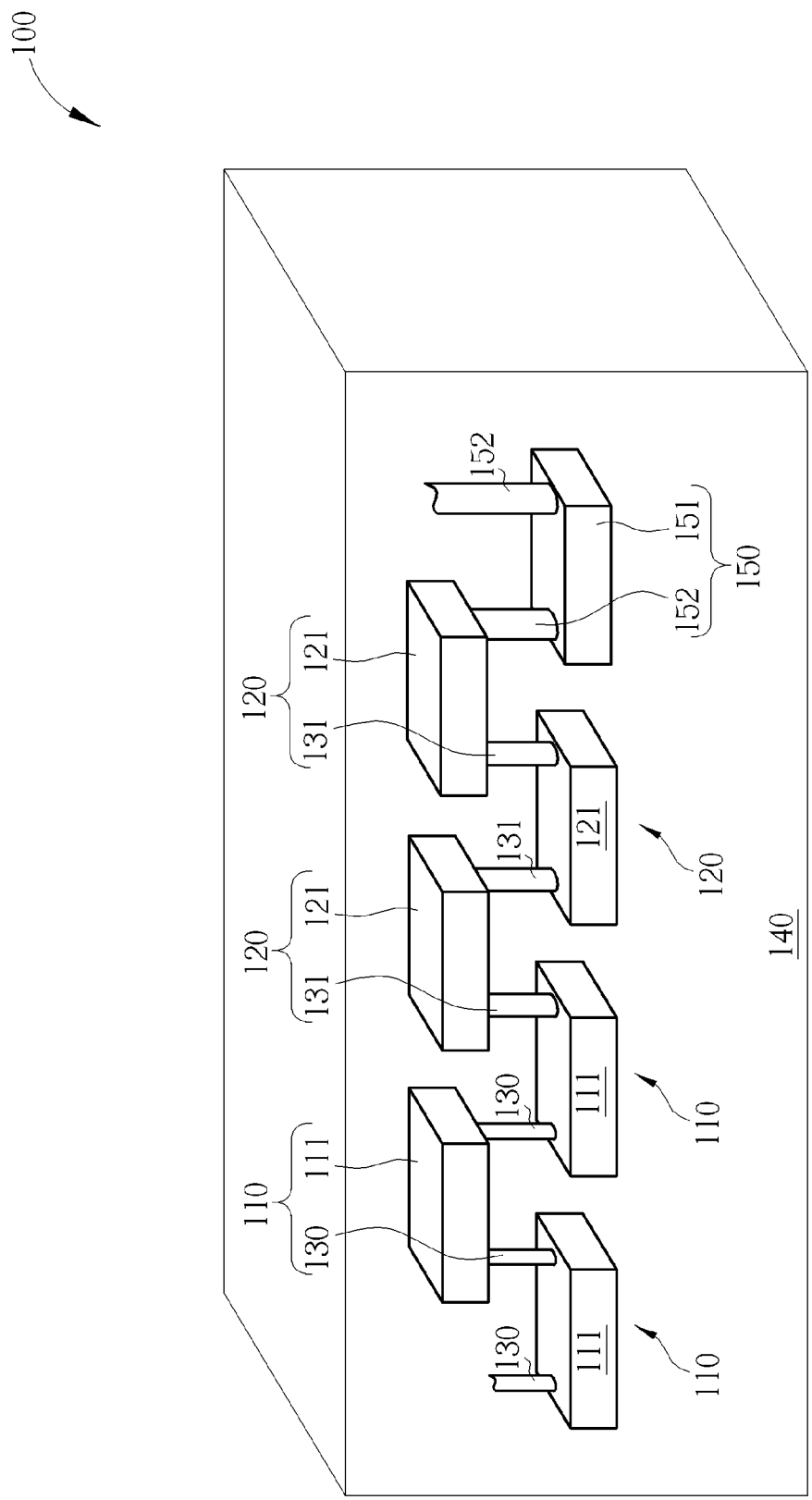

In a first exemplary embodiment of the present invention, as shown in FIG. 1 and FIG. 3, the pyramidal via structure 100 contains first via sets 110 and second via sets 120. Each first via set 110 has a first metal line 111 and one first via plug 130 having a first surface area. All via plugs 130 of the first via set 110 are similar in shape and size. The second via set 120 has a second metal line 121 and only one second via plug 131 in each set of a second surface area. Because each second via plug 131 has a substantially larger dimension (for example a larger surface area, a larger cross-sectional area and/or a larger volume) than each first via plug 130, the second surface area is larger than the first surface area, the second cross-sectional area is larger than the first cross-sectional area or the second volume is larger than the first volume. The surface area means the exterior area of the via set or the via plug, for example.

The first via plug 130 and the second via plug 131 may independently include a conductive material. The electric conductivity of the first metal line 111 and the second metal line 121 is not critical. In other words, the first via plug 130 and the second via plug 131 may independently include a conductive material of lower electrical conductivity, such as tungsten (W). However, the first via plug 130 and the second via plug 131 may also include a conductive material of higher electrical conductivity, such as copper (Cu) or silver (Ag). The insulating material 140 may be oxide, oxynitride or nitride, such as silicon oxide. The metal lines 111 or 121 may also include a conductive material, such as Cu.

In another embodiment as shown in FIG. 3, the via structure 100 may further include a third via set 150. The third via set 150 includes one metal line 151 and a third via plug 152 having a third surface area, a third cross-sectional area and a third volume. The third via plug 152 has a substantially larger dimension, for example a larger surface area, a larger cross-sectional area or a larger volume than that of the second via plug(s) 131. For example, the third surface area is larger than the second surface area.

When high currents pass through the pyramidal via structure 100, the thermal energy from the Joule heating is dissipated more easily due to the large surface area of the second via plug 131. As such, less heat is accumulated in this arrangement. A larger cross-sectional area corresponding to the larger surface area reduces the current density within the via structure 100. The result is less thermal energy generated from the Joule heating of high current, regardless of whether or not the via structure 100 includes a material of higher electric resistance.

Both methods, i.e. a larger cross-sectional area and a larger surface area, provide the benefits of less heat being generated and accumulated. Furthermore, they enable the novel via structure of the present invention to have a smooth temperature gradient across the structure. The abrupt temperature gradient problems which occur in the conventional architecture are thereby solved. As a result, the structure described above further eliminates other problems such as potential failure due to sudden breakdown of the structure, delamination of the structure due to stress, and torsion and cracking of the entire structure. The novel via structure of the present invention shows a reliable integrity under high currents.

A second embodiment of the present invention, as shown in FIG. 2, includes a plurality of first via sets 210 and a plurality of second via sets 220 in the pyramidal via structure 200. In one aspect there is only one first metal line 211 and only one first via plug 230 in each first via set 210. The first via set 210 has a first surface area, a first cross-sectional area and a first volume. All first via plug(s) 230 are similar in shape and size. In another aspect, there are multiple second via plugs 231 and multiple metal lines 221 in each second via set 220. Each second via set 220 having multiple second via plugs 231 and multiple metal lines 221 has an overall second surface area, an overall second cross-sectional area and an overall second volume. In other words, there are more via plugs in the second via set 220 than in the first via set 210. One second via sets 220 may be different in shape or in size from the first via set 210 or another second via sets 220. Because there are multiple second via plugs 231, the second via plugs 231 in each second via set 220 has a larger overall cross-sectional area, a larger overall surface area or a larger overall volume than the first via plug 230 does in each first via set 210. This larger overall cross-sectional area will lead to a lower current density or this larger overall surface area will lead to a better Joule heat dissipation.

The first via plug 230 and the second via plug 231 may independently include a conductive material. The electric conductivity of the first via plug 230 and the second via plug 231 is not critical. In other words, the first via plug 230 and the second via plug 231 may independently include a conductive material of lower electrical conductivity, such as W. However, the first via plug 230 and the second via plug 231 may also include a conductive material of higher electrical conductivity, such as Cu or Ag. The metal lines 211/221 may also include a conductive material, such as Cu. The insulating material 240 may be oxide, oxynitride or nitride, such as silicon oxide.

From a more generic view of the present invention, the first via set has a first surface area, a first cross-sectional area and a first volume. The second via set has an overall second surface area, an overall second cross-sectional area and an overall second volume because the second via set may have one or more second via plugs. One of the features of the present invention is that the overall second surface area is substantially not lessor larger than the first surface area no matter how many via plugs the second via set has. Another feature of the present invention is that the overall second cross-sectional area is substantially not less or larger than the first cross-sectional area no matter how many via plugs the second via set has. Yet another feature of the present invention is that the overall second volume is substantially not less or larger than the first volume no matter how many via plugs the second via set has. This concept may be embodied by various embodiments as described above.

When high currents pass through the pyramidal via structure 200 of the present invention, the thermal energy generated from the Joule heating is reduced as there is a lower current density flowing through the structure. Heat is reduced in this structure even if the via structure 200 includes a material of higher electric resistance. A larger cross-sectional area in total means a larger surface area in total. This allows the thermal energy from the Joule heating of high current to be much more easily dissipated.

Both methods obtain the benefits of less heat generated and accumulated. This enables the novel via structure of the present invention to have a smooth temperature gradient across the entire structure rather than the conventionally abrupt temperature gradient. The problems encountered in the prior art such as potential failure due to sudden breakdown of the structure, delamination of the structure due to stress created by the thermal expansion, as well as torsion and cracking of the entire structure are totally eliminated. The novel via structure of the present invention therefore displays reliable integrity under high currents.

Those skilled in the art will readily observe that numerous modifications and alterations of the device and method may be made while retaining the teachings of the invention.

What is claimed is:

1. A via structure, comprising:
a first via set having a first cross-sectional area; and
at least one second via set having a second cross-sectional area and electrically connected to said first via set, wherein said second via set has a second surface area which is substantially greater than a first surface area of said first via set so that said second cross-sectional area is substantially greater than said first cross-sectional area, and said second via set and said first via set together form an extending via chain.

2. The via structure of claim 1, wherein said extending via chain exhibits a gradient temperature profile when a current passes through said extending via chain.

3. The via structure of claim 1, wherein said extending via chain maintains a structural integrity when a current passes through said extending via chain.

4. The via structure of claim 1, wherein said second via set consists of one single second metal line and one single second via plug.

5. The via structure of claim 1, wherein said second via set comprises multiple second via plugs.

6. The via structure of claim 1, wherein said first via set consists of one single first metal line and one single first via plug.

7. The via structure of claim 1, wherein said second via set has a second volume which is substantially greater than a first volume of said first via set.

8. The via structure of claim 1, wherein at least one of said second via set and said first via set comprises W.

9. The via structure of claim 1, being for use in a back end of a line (BEOL) device.

10. A via structure, comprising:
a first via set of a first cross-sectional area; and
at least one second via set having a second cross-sectional area and electrically connected to said first via set, wherein said second via set comprises a plurality of second via plugs and said second cross-sectional area is not equal to said first cross-sectional area, and said second via set and said first via set together form an extending via chain.

11. The via structure of claim 10, wherein said extending via chain exhibits a gradient temperature profile when a current passes through said extending via chain.

12. The via structure of claim 10, wherein said extending via chain maintains a structural integrity when a current passes through said extending via chain.

13. The via structure of claim 10, wherein said first via set consists of one single first via plug and one single metal line.

14. The via structure of claim 10, wherein said first via set comprises a plurality of first via plugs.

15. The via structure of claim 10, wherein said second cross-sectional area is not less than said first cross-sectional area.

16. The via structure of claim 10, wherein said second cross-sectional area is substantially greater than said first cross-sectional area.

17. The via structure of claim 10, wherein said second via set has a second volume which is not less than a first volume of said first via set.

18. The via structure of claim 10, wherein at least one of said second via set and said first via set comprises W.

19. The via structure of claim 10, for use in a back end of a line (BEOL) device.

* * * * *